United States Patent

Lefebvre et al.

[11] 4,054,486
[45] Oct. 18, 1977

[54] NUCLEAR REACTOR FAIL-SAFE UNIT HAVING THE FUNCTION OF CONTROL RELAY AND CURRENT REGULATION

[75] Inventors: Claude Lefebvre, Les Lilas; Jean-Paul Therond, Versailles, both of France

[73] Assignee: Commissariat a l'Energie Atomique, Paris, France

[21] Appl. No.: 637,438

[22] Filed: Dec. 3, 1975

[30] Foreign Application Priority Data

Dec. 11, 1974  France ................ 74.40770
Dec. 11, 1974  France ................ 74.40771

[51] Int. Cl.² .............. G21C 7/00; H03K 17/02; H03K 5/20
[52] U.S. Cl. .............. 176/20 R; 176/19 EC; 176/24; 328/71; 328/148
[58] Field of Search ........... 176/20 R, 19 EC, 19 S, 176/24, 22; 328/147, 148, 71, 74; 324/120

[56] References Cited

U.S. PATENT DOCUMENTS

| | | | |
|---|---|---|---|
| 3,178,635 | 4/1965 | Runyan | 321/25 |
| 3,191,115 | 6/1965 | Lloyd | 321/16 |
| 3,425,903 | 2/1969 | Bevilacqua | 176/20 R |
| 3,657,660 | 4/1972 | Pfersch | 328/148 |
| 3,888,772 | 6/1975 | Neuner | 176/20 |
| 3,931,522 | 1/1976 | Rusch | 176/19 J |
| 3,940,309 | 2/1976 | Imperiali | 176/22 |

FOREIGN PATENT DOCUMENTS 908,843  10/1962  United Kingdom ........... 176/19 EC

OTHER PUBLICATIONS

Su, "Logic Design & Its Recent Development", Computer Design, Sept. 1973, pp. 65-70.

*Primary Examiner*—Verlin R. Pendegrass
*Assistant Examiner*—Donald P. Walsh
*Attorney, Agent, or Firm*—Sughrue, Rothwell, Mion, Zinn and Macpeak

[57] ABSTRACT

An electronic unit for controlling the safety absorbers of a nuclear reactor comprises a self-supplied $AND_1$ circuit for performing logical multiplication of input signals each capable of assuming one out of two values, series-connected modules each constituted by a dc/ac converter, the output of the last module being coupled to the first converter and to a regulator input at which is obtained a logical a.c. signal whose value corresponds to the result of multiplication of the different input signals, a static intensity regulator with negative current feedback for modulating the width of the square waves delivered by an isolation transformer, a rectifier for delivering a constant current to a load impedance.

11 Claims, 11 Drawing Figures

NUCLEAR REACTOR FAIL-SAFE UNIT HAVING THE FUNCTION OF CONTROL RELAY AND CURRENT REGULATION

This invention relates to a positive-safety, i.e., fail-safe, electronic unit having the functions of control relay and current regulation employed primarily for controlling the current in the coils of electromagnets for maintaining the safety absorbers of a nuclear reactor in position.

The invention is integrated especially in the protection system of a nuclear reactor; in this safety system, it is desired to initiate the dropping of safety absorbers under gravity into the reactor core when certain physical quantities such as pressure, temperature or neutron flux deviate to an appreciable extent from predetermined reference values.

The safety absorbers of the reactor are maintained in the top position by means of an electromechanical device comprising electromagnets in which the coils are supplied with current when said safety absorbers are located outside the reactor core.

It is essential to ensure that when the values of the physical quantities are within the safety limits, the current applied to the coils remains constant. The stability of the current which flows through the coils of the electromagnets for maintaining the safety absorbers in position is necessary for the following reason: a plurality of electromagnet coils are employed for safety reasons in order to maintain a reactor safety absober in the top position. When one of the physical quantities oversteps a given value, the current is cut-off in the coils. In order to initiate dropping of the safety absorber, the current must be suppressed in two coils out of three for example (2 out of 3 redundancy).

The mechanical device is accordingly designed to ensure that, when two of the coils are no longer activated, the restoring force is no longer sufficient to maintain the safety absorber in position. In order to attain a high standard of operational safety, the current in each coil must be closely controlled within precise limits in order to prohibit any appreciable variation in current intensity which would be attended by disastrous consequences since it would prevent dropping of the safety absorber even when two coils are no longer supplied with current. Similarly, it is necessary to ensure that the current values do not vary in the direction of excessively low values at which dropping of the absorber would be brought about by the interruption of current within a single coil.

The extreme precautions which must necessarily be taken in reactor protection systems device the need for a very high standard of operational safety and reliability of electronic control devices. With this objective, it is an advantage to provide control systems which are designed to ensure "intrinsic" positive safety.

The positive safety concept is well known to specialists who are faced with the safety problem; it is understood to mean the ability of a material to undergo a change which tends to initiate the action for which it has been designed in the event of a fault condition which affects said material. The application to initiation of emergency shutdown of a nuclear reactor is presented by way of example. In the case of industrial materials in common use, the "safe" fault rate is of the same order of magnitude as the "unsafe" fault rate. The device in accordance with the invention has an appreciably reduced unsafe fault rate whereas the safe fault rate remains of the same order of magnitude. Unsafe faults are fault occurrences which do not lead to the desired protective action in the event of overstepping of the threshold valve in respect of one of the physical parameters of the protection system.

The control units in accordance with the invention are so designed that the failure of one element of the circuit produces a safe fault condition and that only simultaneous failures of two elements of the circuit are liable to result in an unsafe fault condition.

In accordance with the invention, the unsafe fault rate is approximately 100 times lower at absolute value than that of industrial materials in common use; this result is achieved without any appreciable increase either in the cost or in the dimensions of the electronic circuitry.

The invention is directed to a positive safety unit having the functions of control relay and current regulation employed especially for controlling the safety absorbers of a nuclear reactor, wherein said unit comprises:

a self-supplied "$AND_1$" logic circuit of the positive safety type for performing logical multiplication of $m$ input signals $a, b, c \ldots i, \ldots m$, each of these signals being capable of assuming one out of two distinct values comprising the value O, there being included in said circuit $m$ series-connected modules La, Lb, Lc, ... Li, ... Lm which are coupled to each other by means of electrical isolation transformers, each module being constituted by a dc/ac converter supplied with direct-current voltage corresponding to the logical value of an input signal and with the alternating-current output voltage of the preceding module, the output of the last module Lm of the series being coupled on the one hand to the first converter through a rectifier unit followed by a self-oscillation dc/ac converter which supplies said first converter and coupled on the other hand through an electrical isolation transformer to the input E of a static regulator, there being obtained at said input a logical alternating-current signal whose value corresponds to the result of multiplication of the different input signals $a, b, c, \ldots$, a static intensity regulator with negative current feedback, the input of which is connected through an electrical isolation transformer Ta to the input E, said regulator being intended to operate bu modulation of the width of the square waves of voltage delivered by said transformer Ta, the modulated square-wave voltage being fed to the primary winding of a transformer Tb, a supply A which delivers a direct-current voltage, a rectifier R connected to the secondary winding of the transformer Tb for delivering a constant current to a load impedance via connecting leads, one lead being passed through the static intensity regulator in order to produce the negative current feedback.

The "$AND_1$" circuit constitutes a so-called $1/n$ logic circuit. As will become apparent hereinafter in connection with the application to control of the saftey absorbers of a nuclear reactor, the logical input values of said $AND_1$ circuit correspond to measurements of different physical quantities which characterize the operation of the reactor. The output signal of the $AND_1$ circuit is a periodic signal such as a square-wave signal, for example. It should be noted that the entire control unit operates by making use of periodic signals.

The use of a periodic signal has many advantages. In particular, isolation transformers can be employed for isolating different parts of the circuit. Moreover, by means of the alternating-current signal the device can be continuously tested at the frequency of said alternating-current signal. Finally, a direct-current signal (or zero signal) at the input E of the regulator can have a number of causes: either one of the physical quantities directed to the $AND_1$ circuit exceeds the limiting value of operation, in which case it is essential to initiate reactor shutdown by dropping the safety absorbers into the reactor core or else there is a fault occurrence upstream of the regulator. This type of signal causes interruption of the flow of alternating current and this interruption produces a free fall or "trip" of the safety absorbers; this illustrates the so-called positive safety concept.

The control unit under consideration comprises a static intensity regulator with total negative current feedback in which the input is connected through an electrical isolation transformer Ta to the input E. Said regulator operates by modulating the width of the voltage square-waves delivered by the secondary winding of the transformer Ta. The operation of said static regulator of conventional type comprising a magnetic circuit will be described hereinafter.

The apparatus in accordance with the invention also has a supply A for delivering a direct-current voltage of constant amplitude which is connected to the device but is geometrically separated from this latter; as an advantageous feature, a power amplifier connected to the secondary winding of a transformer Tb (the primary winding of said transformer being connected to the intensity regulator) and to the supply A, the output of said amplifier being connected to the primary winding of a transformer Tc; finally, a rectifier R is connected to the secondary winding of the transformer Tc and delivers a constant current into a load impedance such as the electromagnet coil via leads, one of which passes through the static intensity regulator in order to produce the negative current feedback.

In one embodiment of the invention, the supply A is a storage battery which delivers a voltage of the order of about twenty volts.

In accordance with alternative embodiments of the invention, a voltage amplifier is interposed either between the transformer Ta and the static intensity regulator or between the static intensity regulator and the power amplifier or between both.

The control unit in accordance with the invention also comprises a circuit which is employed for the rapid interruption of current in the load impedance.

An $AND_1$ logic circuit which is designed to ensure intrinsic positive safety is employed in accordance with the invention for generating the "input" signal at the regulator terminal E as a function of the logical values of different initial input quantities.

This type of positive-safety control unit is also integrated in nuclear reactor protection systems in which the values of a certain number of physical quantities such as pressure, temperature, neutron flux and the like are measured at a certain number of points in the nuclear reactor. The values of said physical quantities are then compared with reference values in different control units and a signal of zero value is delivered when the physical quantities are outside a pre-defined range of values corresponding to a suitable margin of reactor safety. When the physical quantities are located within this safety range, the controls units of the system deliver a direct-current output signal of non-zero value. Said direct-current signals constitute the $n/m$ logic inputs.

In one embodiment of the invention, the control unit further comprises $n/m$ logic circuits (usually "three out of four" systems) in which the outputs are each connected to only one input of the $AND_1$ circuit. As will become apparent from the following description, the logic circuits aforesaid produce a logical combination of different input quantities corresponding for example to the measurement of a single nuclear reactor parameter at a number of different points of the reactor. The logic circuits aforesaid are of the dynamic type which provide intrinsic safety and permit the calculation of the function F which has a zero value when $n$ of $m$ input values A, B, C, D . . . are zero; the function F may be written:

$$F = \underbrace{(A + B + C + \ldots)}_{n} \underbrace{(A + B + D + \ldots)}_{n} \underbrace{(A + C + D + \ldots)}_{n} \underbrace{(B + C + D + \ldots)}_{n} \underbrace{(\ldots)}_{n}$$

$$C_m^n \text{ terms}$$

If the function F is to have a zero value, it is necessary and sufficient to ensure that anyone of the factors is zero or in other words that at least one term corresponding to a combination of the M input values taken $n$ by $n$ produces a zero sum. This factorization which is not unique as will become apparent hereinafter in fact shows the manner in which it is possible to realize said function electronically by employing $x$ OR circuits wherein each circuit forms the logical sum of $n$ input values $(A + B + \ldots)$. The output values of each OR circuit are then multiplied in an AND circuit in order to realize the function F.

Further characteristic features and advantages of the invention will become apparent from the following description of exemplified embodiments which are given by way of explanation and not in any limiting sense, reference being made to the accompanying drawings, wherein.

Figure 1:
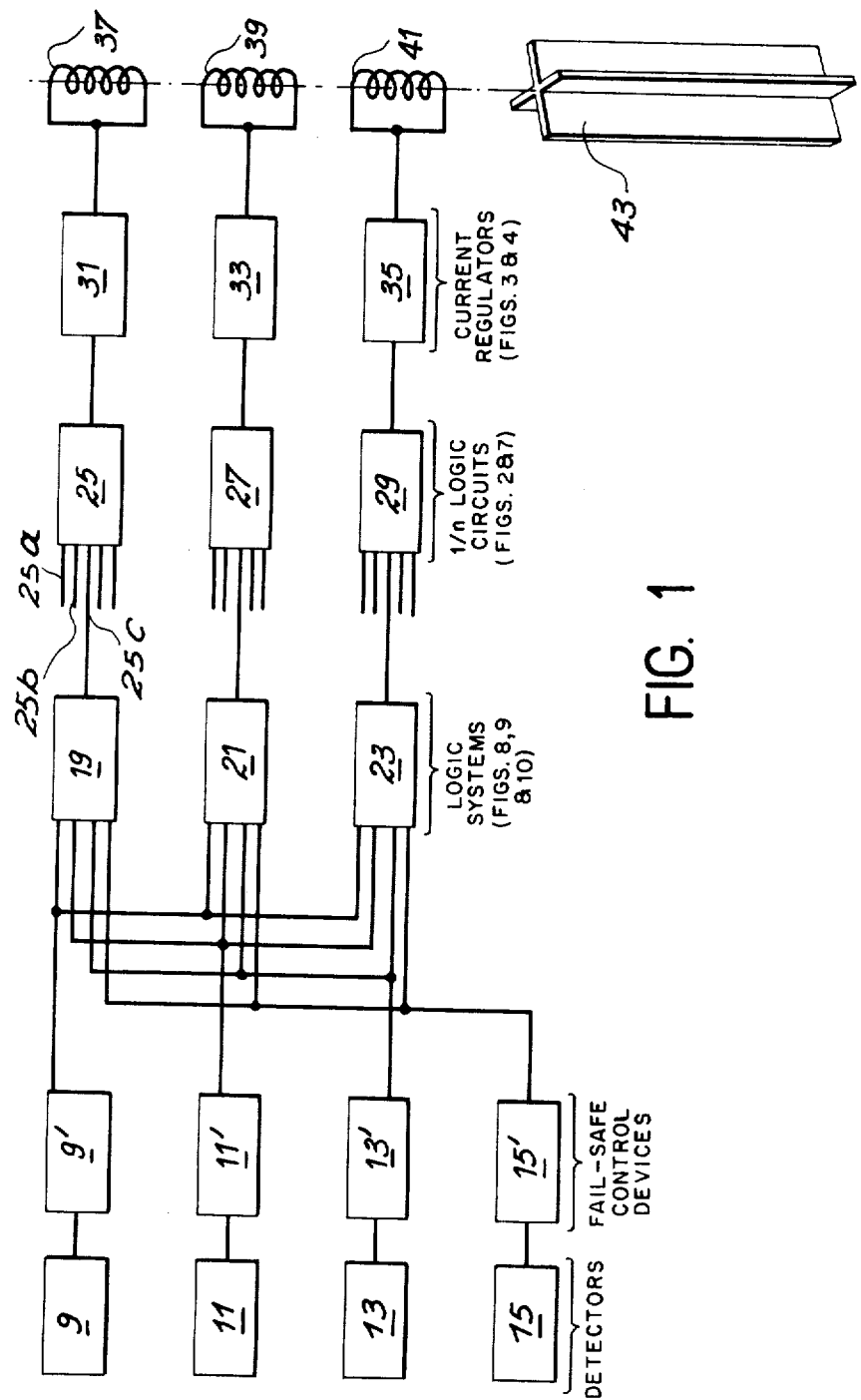
FIG. 1 is a general block diagram of the protection and control system to which the invention applies.

There is shown in FIG. 1 a block diagram of the device for controlling safety absorbers, to which the control unit in accordance with the invention is applicable. There are shown at 9, 11, 13 and 15 four detectors for measuring the same physical parameter such as temperature, for example. The signals delivered by these four detectors (in the case of the figure) are fed into the elements 9', 11', 13' and 15' representing positive-safety control devices as described in our co-pending U.S. Application Ser. No. 637,432 entitled "A Positive Safety Control Device" and filed on Dec. 3, 1975.

The signals emitted by said control devices are fed into the elements 19, 21 and 23 representing "three out of four" logical systems employed in one embodiment of the invention. Said elements are each connected to four pairs of detectors and devices for controlling a single physical parameter. In general, only three channels are connected and this makes it possible, if so desired, to disconnect a detector/control device pair which is in service and to replace this latter by another pair of the same series for purposes of testing or re-calibration. The "three out of four" logical systems operate in "two out of three" coincidence. The $1/n$ logic circuits, that is, the $AND_1$ input circuits such as 25, 27 and 29 each produce a trip order by means of the direct-current logical signals delivered by the control units such as the unit 19. The different inputs of the $AND_1$ input circuits are connected through the channels 25a, 25b, 25c to measuring systems and elements for controlling the different physical parameters (neutron flux, pressure, temperature and the like). The output signals of the $AND_1$ circuits) control the current regulators 31, 33 and 35 of the coils 37, 39 and 41.

The control units in accordance with the invention are concerned with the current-relay and regulating devices such as the device 31 which are controlled by a logic circuit such as 25 having intrisinc positive safety. In one embodiment, said logic circuit 25 is controlled by a "three out of four" logical system providing intrinsic positive safety such as the circuit 19. During normal operation, the safety absorber is in the top position in which it is located outside the reactor core. When two coils out of three are no longer supplied by the relays, the safety absorber 43 drops and permits emergency shutdown of the reactor (2 out of 3 redundancy).

Figure 2:
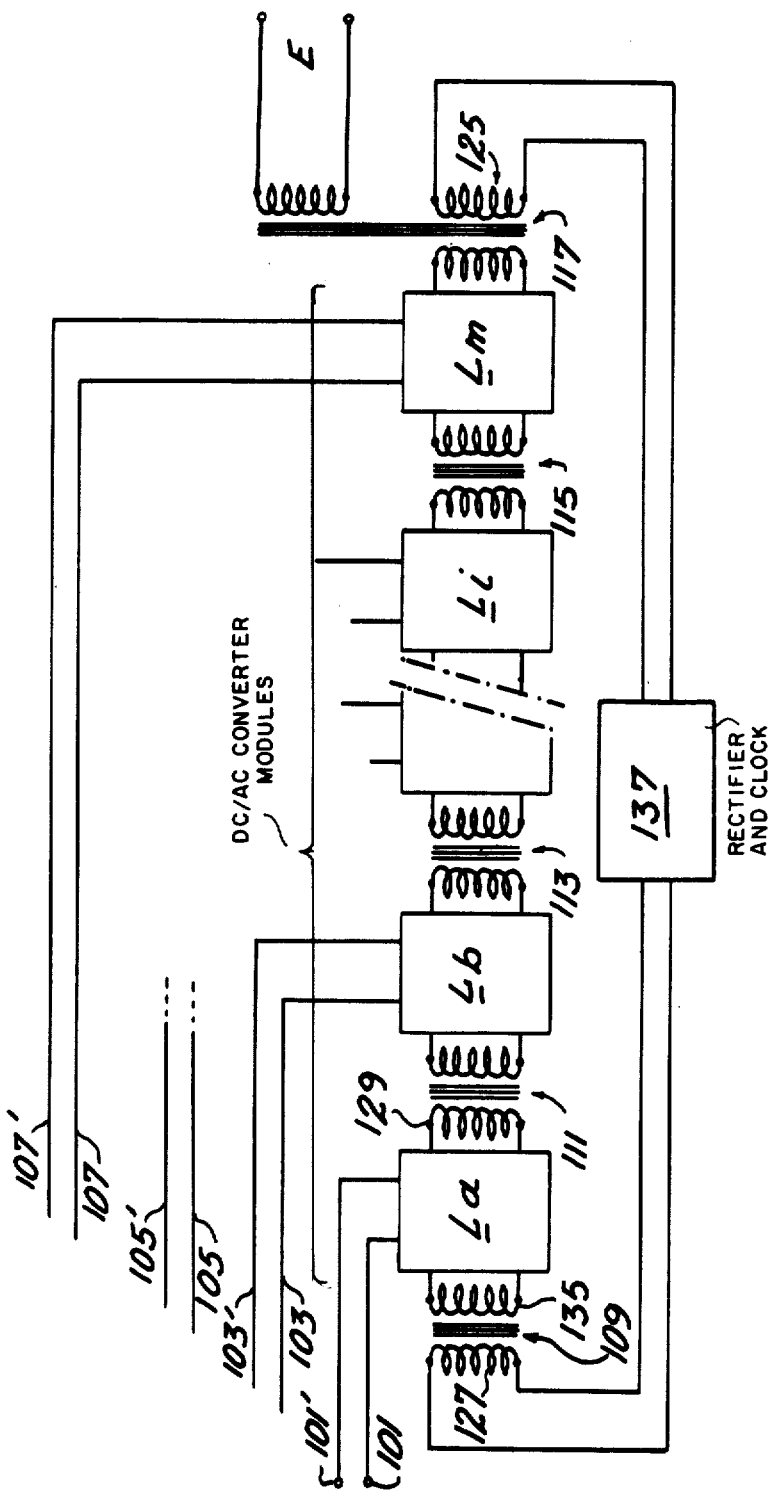
FIG. 2 is a block diagram of the $AND_1$ logical input system of the control unit according to the invention.
Figure 3:
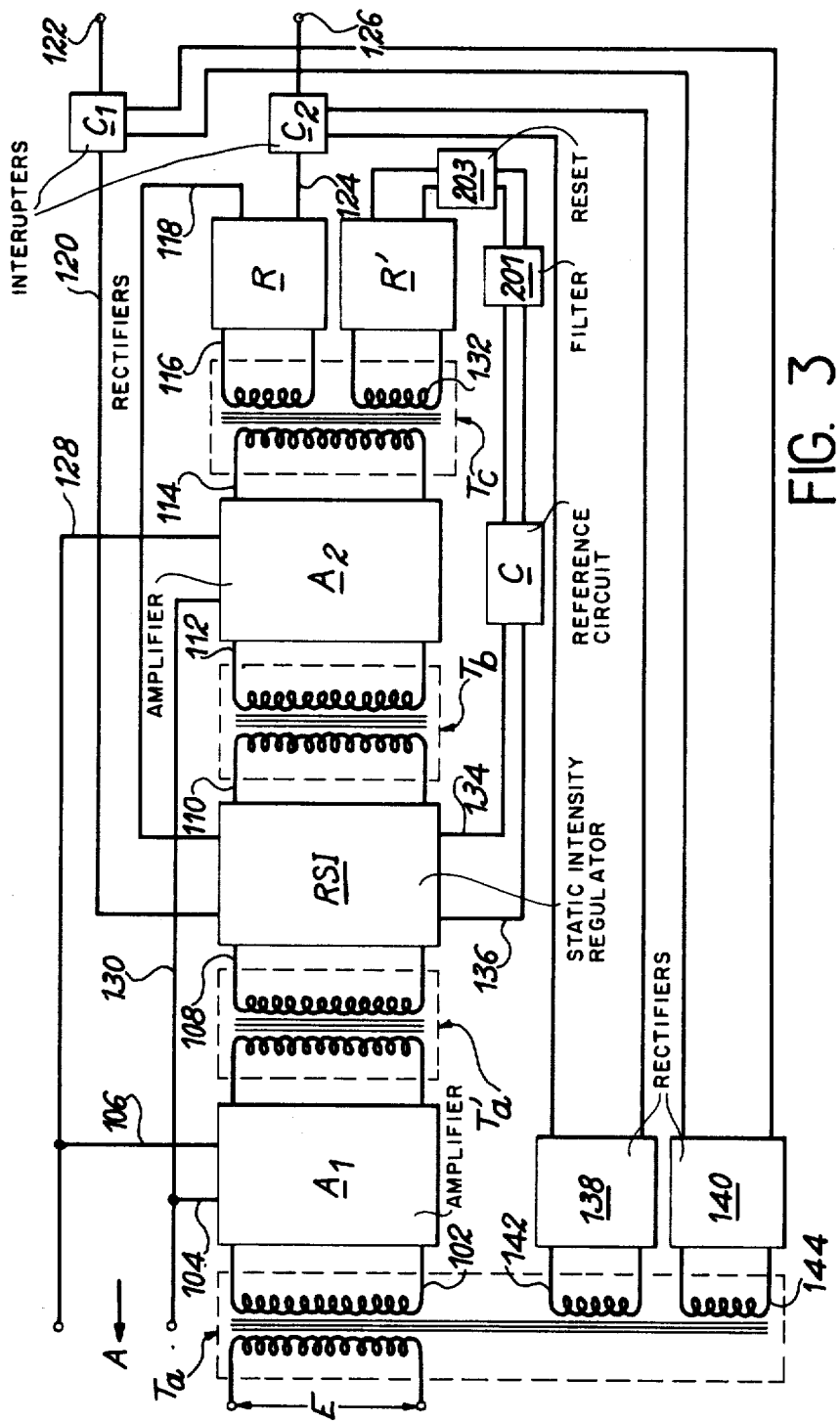
FIG. 3 is a block diagram of the current regulator which is placed downstream of the $AND_1$ logical input system according to the invention.

There is shown in FIG. 2 a block diagram of an $AND_1$ circuit (unit 25 of FIG. 1) which is employed for supplying the input E of the relay circuit shown in FIG. 3. The logical input signals $a, b, c \ldots m$ are applied in the form of the direct-current voltage between the terminals 101 and 101', 103 and 103', 105 and 105', 107 and 107' ... These direct-current voltages are supplied to the modules La, Lb, ... Li and Lm which are placed in series and coupled with each other through electrical isolation transformers 111, 113 and 115. The output of the last module Lm is connected through the electrical isolation transformer 117 to the input terminals E of the relay shown in FIG. 3. The result of the logical operation performed by the $AND_1$ circuit is obtained in the form of an alternating-current voltage at the terminal E. The current supply to the first module La is obtained by means of a feedback loop coupled with the output of the last module Lm through windings 125 and 127. This supply is effected by means of an assembly 137 comprising for example a rectifier and a clock supplied by the rectifier.

It is readily apparent that the number of modules of the circuit is equal to the number of input signals to be multiplied in "logical values".

The operation of each module is as follows: when a direct-current voltae V1 is introduced for example between the leads 101 and 101' of the module La, this value of the direct-current input voltage is present in the form of an alternating-current voltage having an amplitude which is proportional to the direct-current voltage V1 on the output winding 129 of the module La; this winding serves as a primary in the electrical isolation transformer 111. The module La delivers an alternating-current output voltage to the winding 129 when and only when the input winding 135 of the module La is supplied with alternating-current voltage. The output voltage between the two ends of the winding 125 passes through the assembly 137 comprising a rectifier and a clock which feed into the primary winding 127 an alternating-current voltage of suitable frequency such as 1 KHz, for example, when the winding 125 is activated. This feedback loop constitutes the internal supply of the AND circuit which is thus "self-supplied" with the direct-current input voltages.

The association of a plurality of modules such as the modules La, Lb and so forth makes it possible to constitute a $1/n$ logical device (essentially an $AND_1$ circuit) by means of $m$ direct-current inputs which are completely independent and electrically isolated from each other in order to supply the relay in accordance with the invention. The clock contained in the assembly 137 drives the first module La, for example with square-wave signals having a frequency of 1 KHz. It is readily apparent that any other type of periodic signals would be equally suitable such as, for example, sawtooth signals, sinusoidal signals and so forth.

This circuit is of the dynamic type since the system as a whole is tested at the same frequency as the alternating-current supply delivered by the clock. Moreover, during normal operation, the circuit does not require any external supply except in the case of resetting (or in the event of high output power) as will be seen in FIG. 7.

When any one of the inputs 101, 101', 103, 103' and so forth is no longer supplied, one of the modules is no longer supplied with direct-current voltage and the alternating-current output signal delivered has a substantially zero amplitude, with the result that all the downstream modules are no longer supplied with alternating-current and that the alternating-current output signal of the final circuit which appears at the input E of the relay is zero.

FIG. 3 shows a block diagram of the relay device designated by the reference 31 in FIG. 1. The alternating-current logical signal is applied to the input E, for example in the form of square waves having non-zero amplitude. This signal is derived from the output E (FIG. 2) of the $AND_1$ circuit.

A transformer Ta isolates the input from the remainder of circuit, the secondary winding 102 of said transformer being connected to an amplifier $A_1$. Said amplifier $A_1$ is fed from a supply A which is external to the circuit by means of leads 104 and 106. The signal which is thus power-amplified is sent into an electrical isolation transformer T'a, the secondary winding 108 of which is connected to the static intensity regulator. The output of said static intensity regulator is connected to the primary winding 110 of a transformer Tb. The secondary winding 112 of the electrical isolation transformer Tb is connected to a power amplifier $A_2$. The output voltage which is amplified after passing through the amplifier $A_2$ is connected to the terminals of the primary winding 114 of a transformer Tc, one secondary winding 116 of which is connected to a rectifier R.

At the output of said rectifier R, the lead 118 is passed back to the static intensity regulator in order to carry out the total negative current feedback, the output of said regulator being connected to the terminal 122 by means of the lead 120. The other output lead 124 from the rectifier R is connected to the terminal 126. The load impedance (not shown) such as the exciting coil of an electromagnet, is placed between the terminals 122 and 126. The amplifier $A_2$ is connected by the leads 128 and 130 to a supply A which is external to the circuit.

The reference circuit is formed by one winding 132 of the secondary of the transformer Tc, said winding being connected to a rectifier R' which delivers a rectified voltage at its output. This voltage is adjustable by means of a circuit C or so-called reference circuit which is introduced in the static intensity regulator between the leads 134 and 136 in order to establish the value of the output current supplied to the load impedance. There is also introduced a low-pass filter and a manual reset circuit 203 which is connected to the supply A (as shown in FIG. 4).

Two fast interruption circuits $C_1$ and $C_2$ are placed on the leads 120 and 124. These two circuits are supplied with rectified voltages obtained from the rectifiers 138 and 140 which are supplied from the secondary windings 142 and 144 of the transformer Ta.

Figure 4:
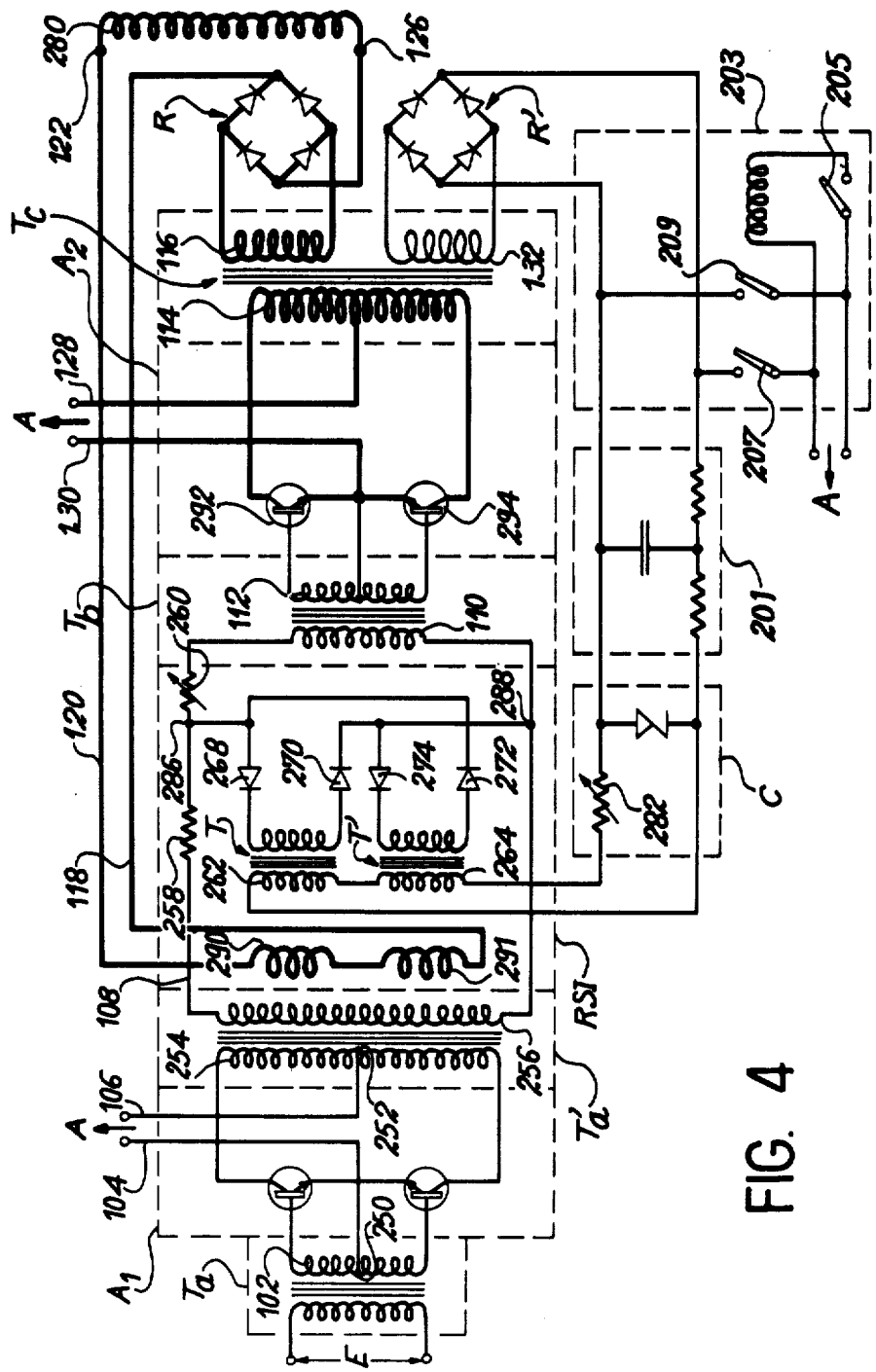
FIG. 4 is a detailed electronic diagram of one embodiment of part of the control unit according to the invention.

There is shown in FIG. 4 a detailed electronic diagram of a portion of the device shown in FIG. 3. The same elements as those illustrated in FIG. 3 are designated by identical references.

Figure 5A:
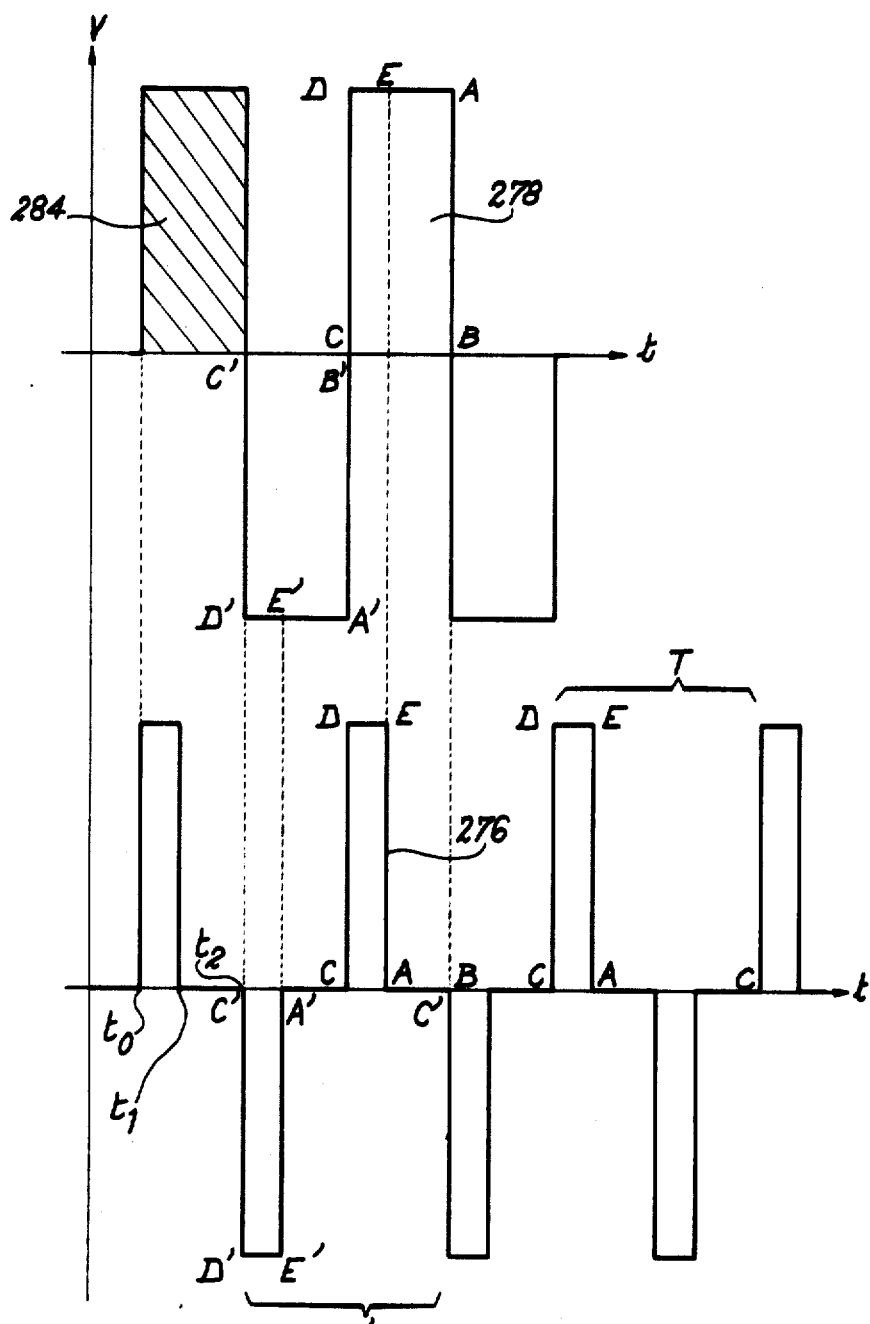
FIGS. 5a and 5b are diagrams explaining the operation of the current-regulating circuit.
Figure 5B:
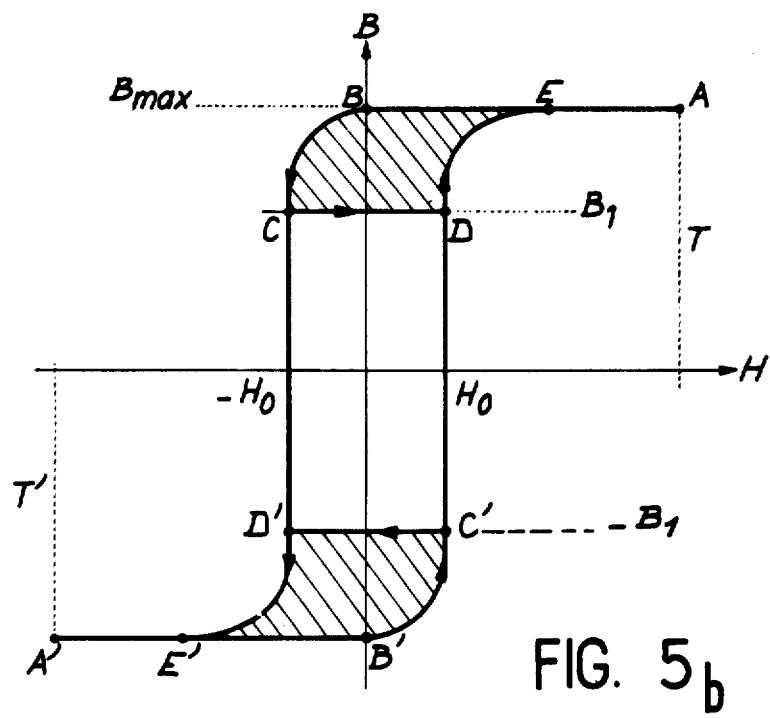

In FIGS. 5a and 5b, there are shown the waveforms of the voltages at different points of the circuit of FIG. 4 and the curve which gives the magnetic induction B as a function of the magnetic field H within the transducers T and T' shown in FIG. 4.

In FIG. 4, the modulator amplifier $A_1$ is constituted by two transistors for feeding the primary winding of the transformer T'a to which power is delivered by the supply A.

The secondary winding 256 of the transformer T'a is connected through resistors 258 and 260 to the primary winding 110 of the transformer Tb. The static intensity regulator comprises two transducers T and T', the magnetization curves of which are indicated in FIG. 5b. The transducers are constituted by magnetic cores surrounded on the one hand by the bias windings 262 and 264 into which is passed a direct current supplied through the circuit C from the rectifier R' formed by a four-diode bridge and, on the other hand, by the drive windings 290 and 291 which are connected to the lead 118, said lead being connected to one terminal of the rectifier R which is formed by a four-diode bridge. The diodes 268 and 270 permit the passage of current in a given direction within the operating winding of the transducer T, said transducer and the two diodes in series being connected in parallel to the primary winding 110 of the transformer Tb. Similarly, there is permitted to pass through the diodes 272 and 274 a current of opposite sign to that which flows through the two diodes 268 and 270 mentioned above. Said diodes 272 and 274 are connected to the operating winding of the transducer T' and the ends of the circuit comprising these diodes are connected to the same terminals as the circuit of said two diodes 268 and 270.

The voltage induced in the primary winding 110 of the transformer Tb is as shown in the portion of curve 276 of FIG. 5a whereas the voltage induced in the secondary winding of the transformer T'a is shown in the curve 278; these two curves represent the variations in voltage V as ordinates and as a function of the time interval $t$ as abscissae. The power amplifier $A_2$ which is connected to the secondary winding 112 of the transformer Tb and fed from the supply A delivers an amplified voltage to the primary winding of the transformer Tc. This voltage is transmitted to the secondary winding 16 of the transformer Tc in order to be rectified and applied to the load impedance located between the terminals 122 and 126 by means of the windings of the static intensity regulator. In a preferred embodiment of the invention, the coil of the electromagnet constitutes the load impedance and is shown diagrammatically at 280.

The circuit C comprises a Zener diode which establishes the potential between the two current supply leads in the windings 262 and 264 of said transducers T and T'. The variable resistor 282 makes it possible to vary the current which passes through the windings 262 and 264.

The points designated by the same letters in FIGS. 5a and 5b correspond to the same operating points. For example, at the instant $t_2$ corresponding to the point C', the magnetic field H has the value Ho in the iron of the transducers T and T' and arises from the sum of the ampere-turns which drive flux through the bias circuit and the control circuit; the magnetic induction within the transducer T' has the value $B_1$. When the voltage at the terminals of the operating winding of the transducer T' is reversed, the representative point on the magnetization curve passes from C' to D' at constant magnetic induction. From D' to E', the voltage applied is constant and the representative point on the magnetization curve passes from D' to E', at which point the core of the transducer is saturated. At this point, the magnetic induction is fixed at the value $B_{max}$ (at absolute value). Between E' and A' and since the core is saturated, the operating winding of the transducer T' between the terminals 286 and 288 is practically in short-circuit (the voltage developed across the terminals of the operating winding is practically zero as shown in FIG. 5a). During the following half-wave, the transducer T comes into action since the diodes 268 and 270 are in the conducting state; the initial magnetic field has the value -Ho since the direction of the current within the bias and drive windings is contrary to the direction of the preceding (transducer T'). A cycle CDABC equivalent to the preceding cycle C'D'A'B'C' is thus performed.

The value of the initial induction $B_1$ is established by the number of ampere-turns in the bias and drive windings such as 262 and 290. This initial value can be adjusted so as to determine the time-duration of flow of the current between t0 and t1 by controlling the value of the resistor 282 which establishes the value of the voltage applied to the terminals of the bias winding 262 of the transducer T and the winding 264 of the transducer T'. The windings 262 and 290 carry currents which circulate in opposite directions, with the result that the ampere-turns are subtracted from each other. It is also apparent that the current which flows through the electromagnet coil 280 depends on the interval between the saturation point $B_{max}$ and the initial point $B_1$ of FIG. 5b since no voltage is developed across the terminals of the primary winding and secondary winding of the transformer Tb or in the downstream portion of the circuit when the transducers T or T' are saturated.

The system is self-stabilizing since the current which flows through the coil 290 decreases if the current in the electromagnet coil is reduced. This also reduces the value of the ordinate of the point $B_1$ but consequently increases the time of passage of the current within the primary winding 110 of the transformer $Tb$.

It can be verified in the diagram of FIG. 4 that the device provides intrinsic safety or in other words that, in the event of faulty operation of any one of the circuit elements, such faulty operation gives rise to a safe fault condition which initiates interruption of the current within the output impedance 280; this type of fault condition can be either the interruption of a cable, the opening or short-circuit of a diode, the short-circuit of a transistor, etc.

The circuit of FIG. 4 further comprises a resetting circuit 203 for closing the two switches 207 and 209 by means of the manual switch 205, thus permitting the flow of current within the bias windings and restoring the circuit after an interruption.

Figure 6:
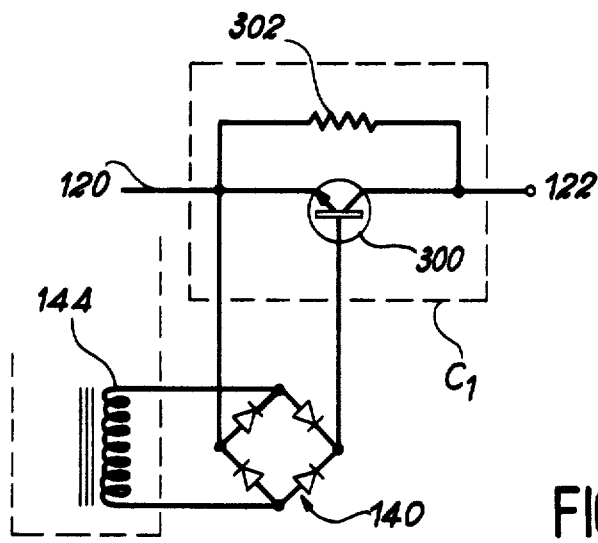
FIG. 6 is a diagram of the electronic circuit for rapid current interruption.

There is shown in FIG. 6 a fast current interruption device such as the circuit $C_1$ or the circuit $C_2$ of FIG. 3. Said circuit is provided on the lead 120 before the terminal 122 with a transistor 300, the base of which is biased by the voltage derived from a rectifier 140 which is supplied from the secondary winding 144 of the transformer $Ta$. The parallel-connected resistor 302 has a value of a few hundreds of ohms. The operation of this circuit is as follows: when a signal is applied to the input E, a current is generated in the secondary winding of the transformer $Ta$ which biases the base of the transistor so as to trigger this latter into conduction. In the event of interruption of the current within the secondary winding 144, the transistor 300 is caused to cut-off and the current flows through the highvalue resistor 302, thereby resulting in a much shorter current decay time (which is proportional to L/R, where L is the load inductance and R is the value of the resistor 302).

It has been established that the fast cut-off devices (1 out of 2 redundancy) permit a decay of 90% of the initial current within a time interval of less than 10 ms in respect of the value L of the coil inductance.

Figure 7:
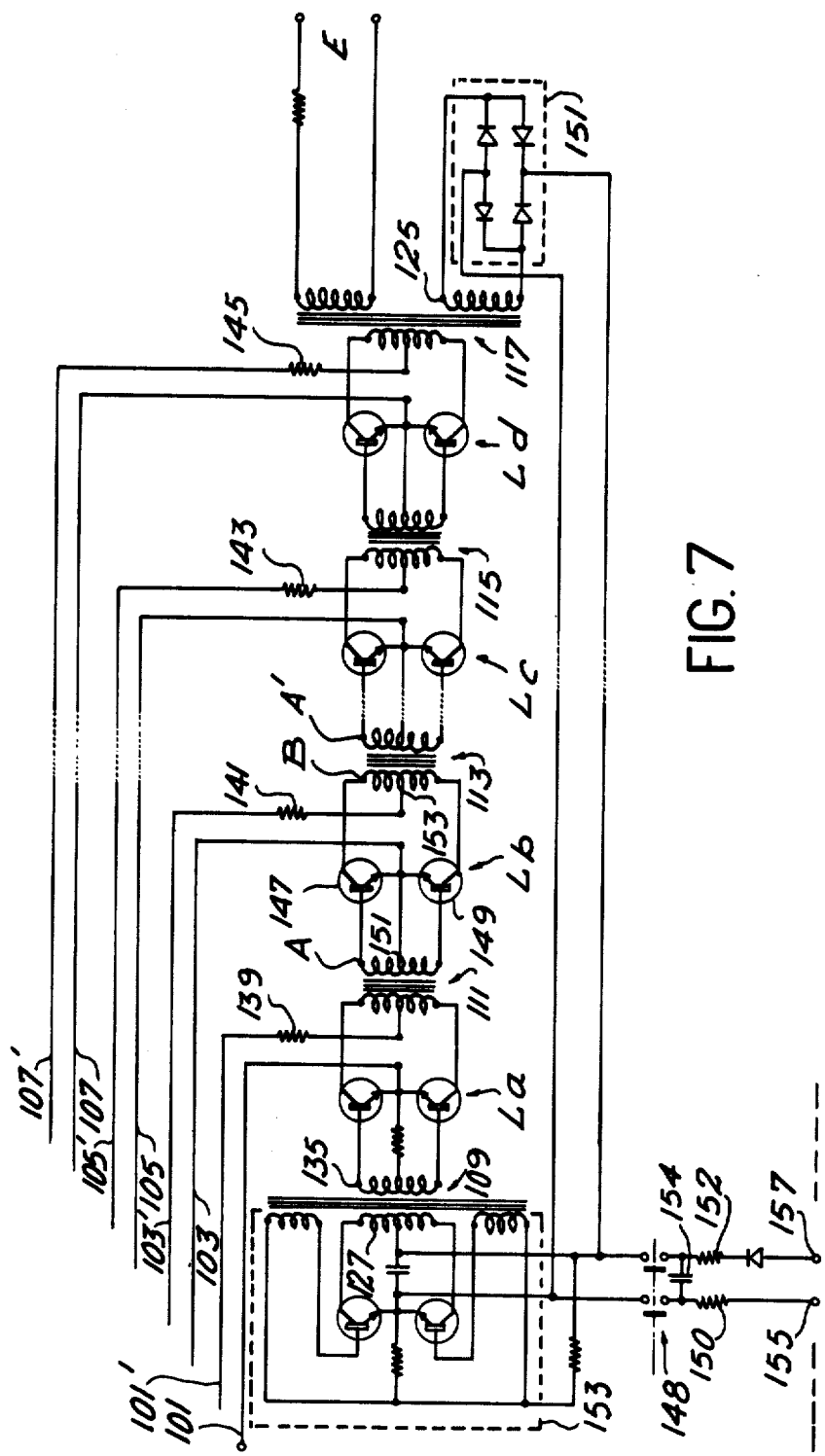
FIG. 7 is an electronic diagram of an $AND_1$ input circuit comprising four modules according to the invention.

FIG. 7 shows the electronic diagram of an $AND_1$ circuit having four modules, this circuit being designed to provide intrinsic safety of the dynamic type in accordance with the invention. As in FIG. 2, the signals are introduced between the terminals such as 101, 101', 103, 103', 105, 105', 107, 107'. The voltages between said terminals supply the modules $La$, $Lb$, $Lc$, $Ld$ and the circuits for supplying directcurrent voltage being provided with the resistors 139, 141, 143, 145.

Each module is a dc/ac convertor of a conventional type comprising a first winding such as the winding A of the module $Lb$ which is coupled by the transformer to the output winding of the preceding module, in this case the module $La$. The module $Lb$ comprises two transistors 147 and 149, the bases of which are connected to the ends of the winding A. The emitters of the transistors 147 and 149 are connected to each other and to the mid-point 151 of the winding A. The collectors of said two transistors 147 and 149 are connected to the ends of a winding such as the winding B which is coupled to the winding A' of the following module by means of an electrical isolation transformer such as the transformer 113. The direct-current voltage in the case of the module $Lb$ which is derived from the terminals 103 and 103' is connected between the point 151 which is common to the emitters of said transistors and the mid-point 153 of the winding B. Said electronic circuit is reproduced in all the modules $Li$.

The circuit 137 of FIG. 2 is shown in detail in FIG. 7 and comprises a rectifier 151 and a clock constituted by a self-oscillating dc/ac converter 153 which is supplied by said rectifier. The rectifier 151 which is formed in the case of the figure by a four-diode bridge of conventional type rectifies the voltage obtained at the secondary winding 125 of the transformer 117 in order to direct said voltage to a dc/ac converter 153 which performs the function of a clock and is practically identical in design to the converter of the modules $Li$. Said converter 153 has the function of transforming the direct-current voltage at the output of the rectifier 151 into an alternating-current voltage supplied to the primary winding 127 of the transformer 109, the secondary winding 135 of which serves to supply the first module $La$.

In the circuit shown in FIG. 7, provision is also made for a manual resetting device comprising a push-button 148 for connecting the direct-current supply of the converter 153 to a voltage source of 24 volts for example (not shown), said source being connected between the two terminals 155 and 157.

If all the direct-current voltage inputs are supplied with "non-zero" voltages (logical value of +1), each module (controlled by the alternating-current voltage of the preceding module) delivers to the following module a synchronous square-wave signal having a non-zero amplitude at the frequency $f$. There is obtained from the output of the logic circuit a square-wave signal applied for example to the input E of the relay shown in FIG. 2, which corresponds to the logical level 1. If any one of the inputs 101, 101', 103, 103' and so forth has a level O, there is no longer any transmission of the square-wave signal beyond this cell and the output signal of the circuit changes to the state O. The circuit is completely endowed with intrinsic safety, which means that there does not exist any initial unsafe fault condition and only a limited number of double failures is unsafe; the probability of occurrence of this type of failure is very small (for example a short-circuit between four leads taken in pairs a given order).

In accordance with one arrangement of the invention, the $AND_1$ circuit (such as the device 25 of FIG. 1) is not driven directly but by means of a $n/m$ logical device of dynamic type. In a first embodiment, the $n/m$ logical device comprises:

$x$ OR circuits each connected to $n$ inputs, where $x$ is equal to the combinations without repetition of the $m$ inputs taken $n$ by $n$;

$$x = C_m^n = \frac{m!}{n!(m-n)!}$$

an AND circuit having $x$ inputs each connected to the output of one of the $x$ OR circuits, said AND circuit being of the dynamic type in which the outputs of the $x$ OR circuits are multiplied after said direct-current signals delivered by the $x$ OR circuits have been converted to periodic signals having an amplitude which is proportional to the direct-current input signals.

If $F$ is the function to be performed, that is, a function having a zero value when $n$ of the $m$ input values A, B, C, D, are zero, the function $F(n/m)$ may be written:

$$F = \underbrace{(A + B + C + \ldots)}_{n} \underbrace{(A + B + D + \ldots)}_{n} \underbrace{(A + C + D + \ldots)}_{n} \underbrace{(B + C + D + \ldots)}_{n} \underbrace{(\ldots)}_{n}$$

$$C_m^n \text{ terms}$$

For the function $F$ to be of zero value, it is necessary and sufficient to ensure that any one of the factors is zero or in other words that at least one term corresponding to a combination of the $m$ input values taken $n$ by $n$ gives a zero sum. This factorization which is not unique as will become apparent hereinafter clearly shows the manner in which said function can be performed electronically by employing $x$ OR circuits in which each circuit forms the logical sum of $n$ input values($A+B+\ldots$). The output values of each OR circuit are then multiplied in an AND circuit in order to realize the function $F$.

As will be seen later, the logic circuits of this type are also self-supplied and do not require any external supply except for resetting and in the event of the need for high output power.

Figure 8:
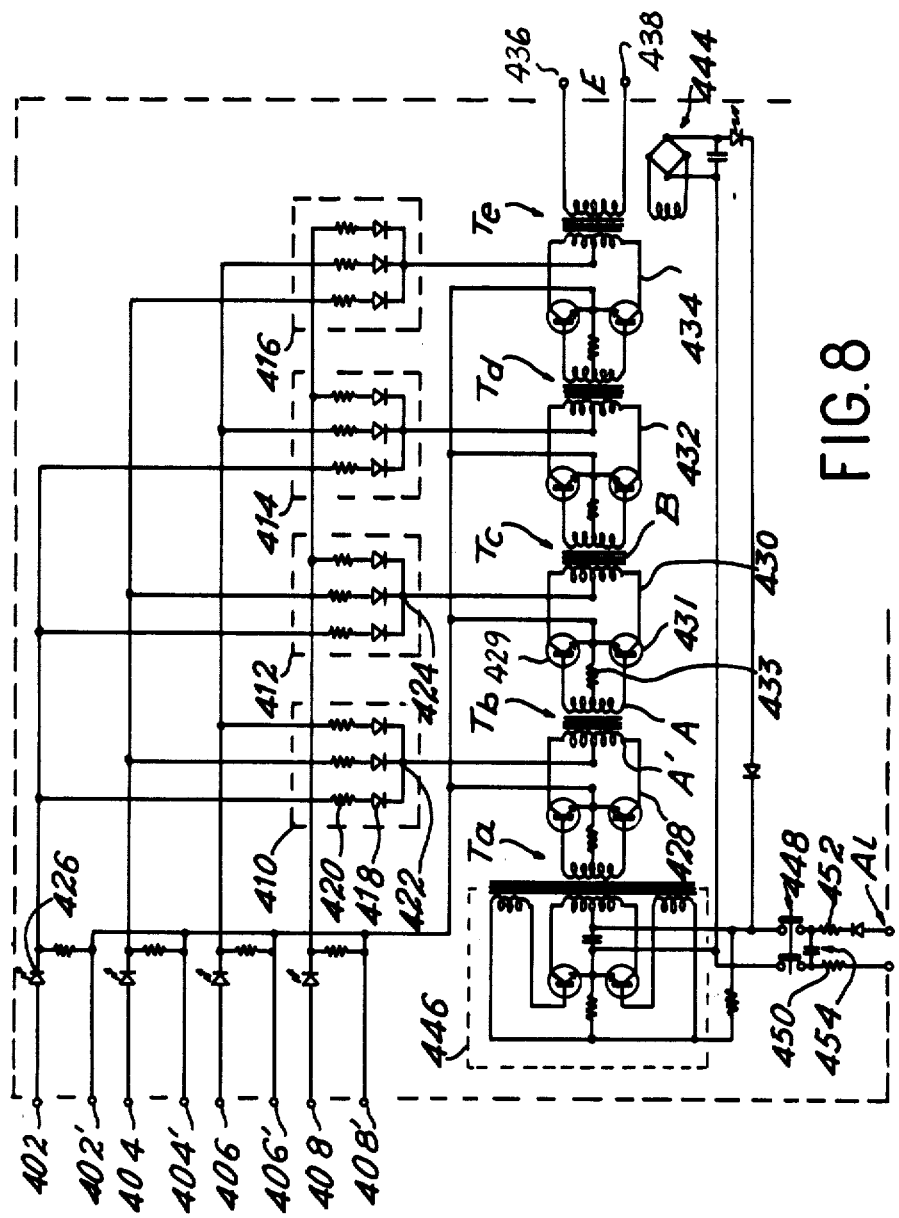
FIG. 8 is a diagram of a "three out of four" logical system placed upstream of the $AND_1$ circuit.
Figure 9:
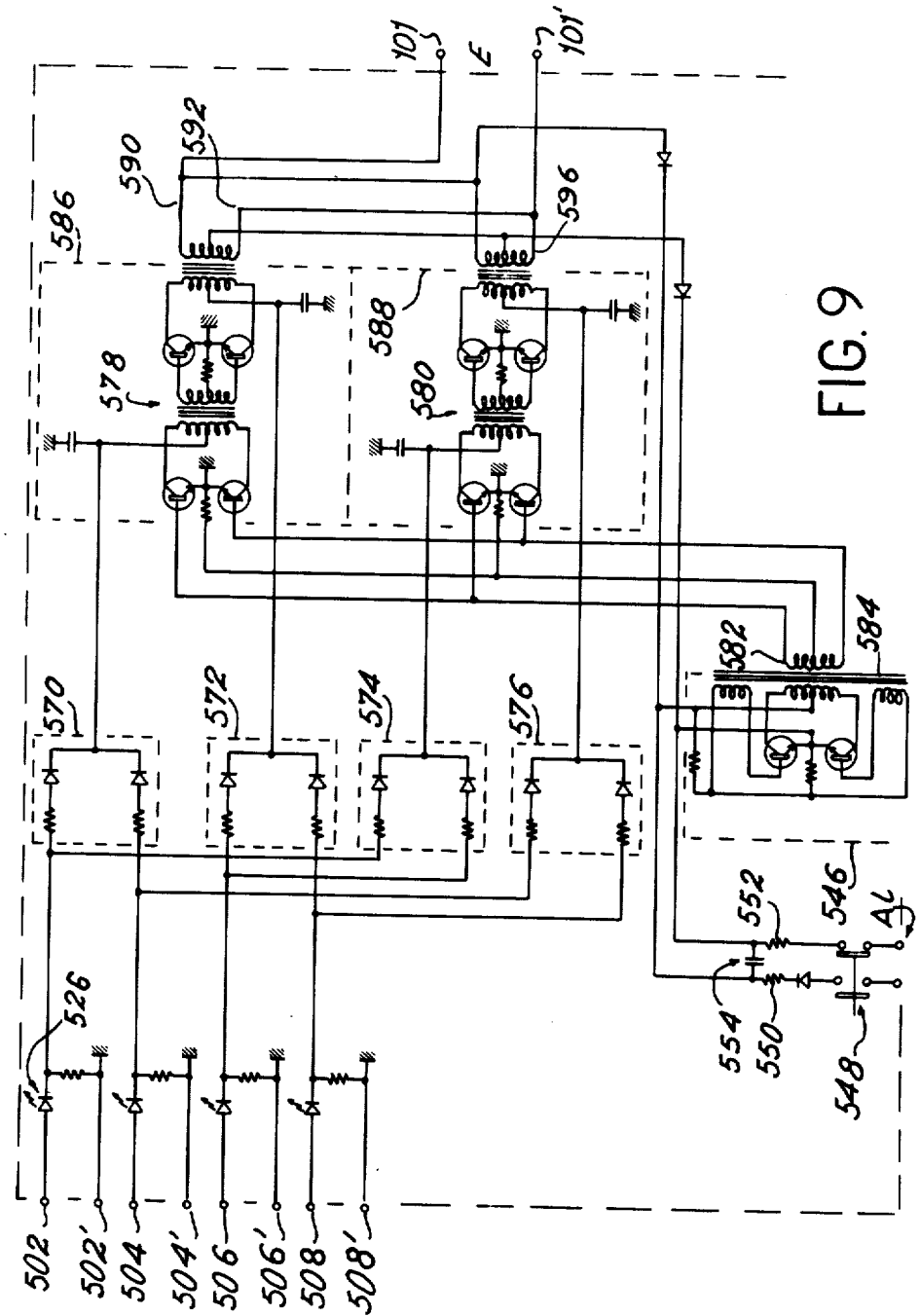
FIGS. 9 and 10 show the two "three out of four" logical systems placed in two embodiments of the invention upstream of the $AND_1$ circuit.
Figure 10:
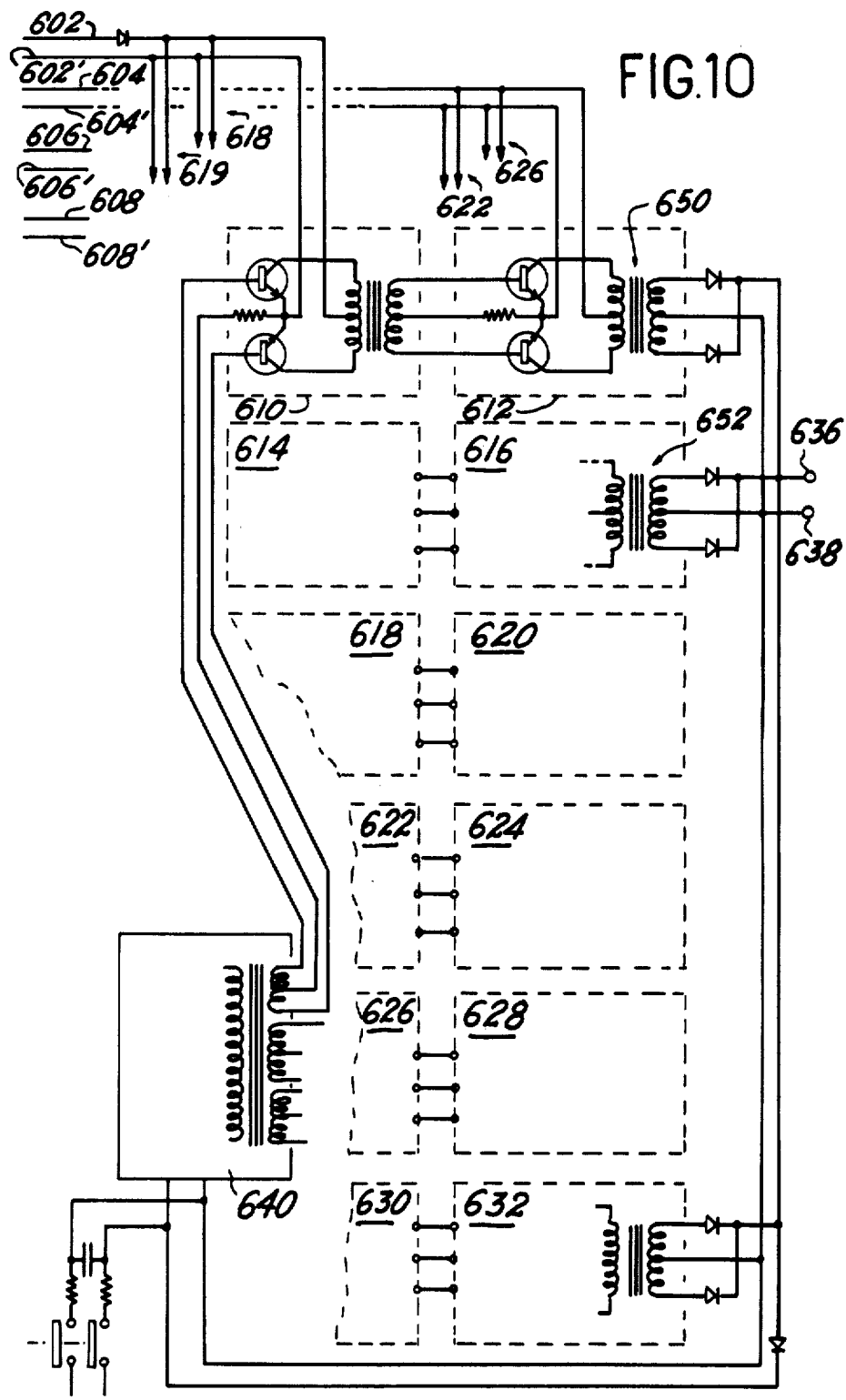

In FIGS. 8, 9 and 10, there are shown three 3 out of 4 logic systems such as $n/m$ systems which make use of AND circuits. In the case of 3 out of 4 logic, $F$ being the function to be realized and A, B, C and D being the four inputchannels, the function $F$ may be written:

1. $F = AB + AC + BC + BD + CD$ or

2. $F = (A+B)(C+D) + (A+C)(B+D)$ or

3. $F = (A+B+C)(A+B+D)(A+C+D)(B+C+D)$

The last factorization is the most "natural" and corresponds to the generalization $n/m$ which was described earlier.

The first embodiment shown in FIG. 10 results in the use of twelve cells grouped together in pairs, the six groups being in parallel with respect to each other; this embodiment entails the use of a maximum number of unitary cells in respect of a 3 out of 4 logic system but provides a higher degree of safety (as shown in FIG. 10).

The second relation makes it necessary to have two groups of cells, the inputs of each cell being the sum formed by means of two diodes, of two out of the four input voltages corresponding to the values A, B, C, D. The two groups are associated in parallel. This embodiment will be shown in detail in FIG. 9.

The third relation entails the need for a conventional 3 out of 4 logic system which can readily be generalized as indicated in the foregoing; the input of each of the four cells in series is constituted by the summation of three direct-current input voltages.

FIG. 8 is an electronic diagram showing a 3 out of 4 logic system providing positive safety. The values of the quantities A, B, C and D are introduced between the terminals 402 and 402', 404 and 404' 406 and 406', and 408 and 408'. The terminals 402', 404', 406' and 408' are connected to each other. In the OR circuits such as 410, 412, 414 and 416, the sum function $A+B+C$ is performed in the circuit 410, the sum function $A+B+D$ is performed in the circuit 412, the sum function $A+C+D$ is performed in the circuit 414 and the sum function $B+C+D$ is performed in the circuit 416. These OR circuits are composed of diodes such as 418 which are associated with resistors such as 420. The output voltage between the points 422 and 424 for example is different from zero if any one of the input signals A, B or C is different from zero and the same applied to the other circuits.

The diodes such as 426 are electroluminescent diodes which serve to check the signals from point to point at various points of the circuit. The $AND_2$ circuit is constituted in this case by four converters 428, 430, 432 and 434. After rectification by the diodes 440 and 422 representing the function F, the output voltage is obtained at the terminals 436 and 438 at the output of the secondary of the last electrical isolation transformer Te so as to belivered to one input of the $AND_1$ circuit. By way of example, the terminals 436 and 438 coincide with the terminals 101 and 101' of FIG. 2. Provision is also made for a rectifier 444 constituted for example by a four-diode bridge after a secondary winding of the transformer Te. Said rectifier delivers a direct-current voltage to the self-oscillation converter which supplies the primary winding of the electrical isolation transformer Ta designated by the reference 446. A reset push-button 448 connects the direct-current supply of the modulator 446 to a supply A1 (not shown in the figure) for resetting the circuit. The reset time is determined by the RC constant which is established by the value of the resistors 450, 452 and of the capacitor 454.

Each converter comprises a first winding coupled by means of a transformer Tb to one winding of the above-mentioned module and two transistors such as those designated by the references 429 and 431; the emitters of said transistors are connected to each other and to the mid-point of the winding A through a resistor 433. The collectors are connected to both ends of a winding B which is coupled to the winding A' of the adjacent module.

The operation of the device shown in FIG. 8 is as follows: when three of the values of the four functions A, B, C, D are zero, one of the OR circuits such as those designated by the references 410, 412, 414 or 416 produces a zero output voltage in one of the converter modules such as those designated by the references 428, 432 and 434. Since said converter is no longer supplied with direct-current voltage, the terminal voltage of its output winding is zero and the $AND_2$ circuit constituted by all four modulators is interrupted, whereupon no output signal is delivered between the terminals 436 and 438. On the contrary, when none of the combinations of the four input values taken three by three is zero, all the modulators transmit the signals from the primary winding to the secondary winding and a direct-current voltage appears at the output between the terminals 436 and 438.

It can readily be ascertained whether a simple fault condition is a "safe" fault in the different elements of the circuit: for example, the opening of a diode in an OR circuit produces a zero output signal at the output of the diode, a short circuit in the transistor of a modulator results in continuous conduction and the output voltage of an OR circuit is thus continuously applied to the winding of an electrical isolation transformer between two modulators, with the result that said transformer is saturated and thus no longer transmits a periodic signal.

In FIG. 9, there is shown an alternative form of construction of a 3 out of 4 logic system which forms part of the control unit according to the invention and serves to compute the function:

$$F_1 = (A+B)(C+D) + (A+C)(B+D)$$

The same references on a scale of 500 indicate elements having the same functions as those of the scale 400 of FIG. 8. OR circuits of conventional type such as the circuits 570, 572, 574 and 576 constituted by diodes are placed at the inputs A, B, C, D. The logical functions $A+B$, $C+D$, $A+C$, $B+D$ are obtained at the output of said OR circuits. The output of said circuits is accordingly connected to converters which are coupled by means of electrical isolation transformers such as the transformers 578 and 580. Said converters are of the type described earilier in which the common primary winding 582 is supplied through an electrical isolation transformer 584 by a converter 546 which is in turn supplied with the output voltage obtained at the output of the two AND circuits. The first $AND_3$ circuit 586 performs the multiplication of the function $(A+B)$ by the function $(C+D)$ and the second $AND_3$ circuit 588 performs the multiplication of $(A+C)$ by $(B+D)$. There appears between the terminals 598 and 600 an output voltage which is first rectified by the diodes 590, 592, 594, 596 and is then delivered to inputs such as 101 and 101' of the $AND_1$ circuit of FIG. 2; the amplitude of said voltage corresponds to the logical values of the function $F_1$. The diodes such as 526 are luminescent diodes.

There is shown in FIG. 10 a third form of construction of a 3 out of 4 logic system comprising six self-supplied $AND_4$ circuits of the dynamic type having positive safety, each of these circuits being such as to comprise two modules in series for performing the operations AB, AC, AD, BC, BD and CD, and an OR circuit, the inputs of which are supplied from the outputs of six above-mentioned $AND_4$ circuits. The circuit shown in FIG. 10 permits computation of the logical function $F_2$:

$$F_2 = AB + AC + AD + BC + BD + CD$$

The direct-current logical values of the variables A, B, C and D are delivered to the inputs 602, 602'; 604, 604'; 606, 606'; 608 and 608'. The six $AND_4$ circuits each comprise two modules 610 and 612 supplied with direct current by two of the inputs corresponding to the values of A and B for example and with alternating current by an oscillating clock 640. The modules of the $AND_4$ circuits are not described in greater detail since they are identical with the AND modules of the previous figures. The OR circuit is constituted by the junction of the different secondary windings of the last transformers such as 650, 652 and so forth of the second AND modules of each $AND_4$ circuit. The logical direct-current values of the function F are obtained between the terminals 636 and 638 and are sent to an input such as 101 - 101' of FIG. 2. The circuit of FIG. 10 further comprises a self-supplied oscillating clock 640, said clock being also provided with a manual reset which is identical with the corresponding devices of FIGS. 8 and 9.

In the embodiment of the invention which includes the $n/m$ logic circuits (3 out 4 logic) and $n/m$ logic circuit (3 out 4 logic) as shown in FIGS. 8, 9 or 10 corresponds to each input of the $AND_1$ circuit.

As in FIG. 8, it can be ensured in the circuits of FIGS. 9 and 10 that the device provides positive safety by examining the possible failures of different elements of the circuit one by one and ascertaining whether a failure of one element of the circuit produces at its output a value of the signal which is equal to zero. The circuits of FIGS. 9 and 10 further comprise the reset push-button as in the case of the circuit shown in FIG. 6 and are also self-supplied.

It is readily apparent that the electronic construction of the circuit permits of alternative forms which remain within the definition of equivalent means and therefore within the scope of the invention. For example, the OR diode logic circuits can clearly be converted to transistor logic circuits without changing the scope of the application of the AND circuits to the construction of $n/m$ logic circuits and that the association of OR and AND makes it possible to realize any of the combinational functions of m logical input quantities in accordance with various design solutions which may be contemplated.

What we claim is:

1. In a fail-safe circuit for controlling the current in the coils of electromagnets for maintaining the safety absorbers of a nuclear reactor in a top position outside the reactor core under normal conditions and permitting the safety absorbers to drop under gravity into the reactor core when certain monitored physical quantities deviate to an appreciable extent from predetermined reference values, the improvement comprising:

a self-supplied "$AND_1$" logic circuit of the positive safety type for performing logical multiplication of m input direct-current signals $a, b, c, \ldots, i \ldots, m$, each of said input direct-current signals being capable of assuming one out of two distinct values including a 0 voltage value, said "$AND_1$" circuit comprising m series-connected dc/ac converter modules which are coupled to each other by means of electrical isolation transformers each of said $m$ dc/c converter modules being supplied with a corresponding one of said direct-current input signals and with the alternating-current output voltage of the preceding module, an output isolation transformer having first and second secondary windings, and a rectifier and a self-oscillation dc/ac converter, the output of the last dc/ac converter module of the series being coupled on the one hand to the first dc/ac converter module through the first secondary winding of said isolation transformer, said rectifier followed by said self- oscillation dc/ac converter to supply the first dc/ac converter module with an alternating-current voltage and coupled to the other hand through the second secondary winding of said isolation transformer to the output of the "$AND_1$" logic circuit, there being obtained at said output a square-wave signal whose amplitude valve corresponds to the result of the logical multiplication of the different input direct-current signals $a, b, c, \ldots, i, \ldots, m$, a static intensity regulator with negative current feedback, the input of which is coupled to the output of said "$AND_1$" logic circuit, said regulator modulating the width of the square-wave signal delivered by the output of said "AND₁" logic circuit, an output isolation transformer, the modulated square-wave signal from said static intensity regulator being coupled to the primary of said output isolation transformer, and a rectifier connected to the secondary winding of said output isolation transformer for delivering a constant current to a load constituted by one of the coils of said electromagnets, the output of said rectifier also being connected to said static intensity regulator to produce the negative current feedback.

2. The improvement according to claim 1, further comprising a first intermediate isolation transformer, and a power amplifier, said first intermediate isolation transformer being connected to the output of said static intensity regulator and said power amplifier being connected between said first intermediate isolation transformer and said output isolation transformer.

3. The improvement according to claim 2 further comprising a second intermediate isolation transformer, and first and second voltage amplifiers, said second intermediate isolation transformer being connected to the output of said "AND₁" logic circuit, said first voltage amplifier being connect between said second intermediate isolation transformer and said static intensity regulator, and said second voltage amplifier being connected between said static intensity regulator and said power amplifier.

4. The improvement according to claim 1 further comprising a fast interruption circuit connected between said output isolation transformer and one of the coils of said electromagnets, said fast interruption circuit comprising a transistor having a base, collector and emitter, the emitter and collector being connected in series between said rectifier and one of the coils of said electromagnet, a resistor connected between the emitter and collector of said transistor, and a direct-current voltage supply means responsive to the output of said "AND₁" logic circuit connected to the base of said transistor for supplying a bias voltage when a square-wave signal is supplied by the output of said "AND₁" logic circuit.

5. The improvement according to claim 1, wherein said static intensity regulator comprises first and second transducers each having a drive winding, a bias winding and an operating winding, the drive windings of said first and second transducers being connected in series with one another and in series with said rectifier and the coil of one of said electromagnets, a second rectifier, said output isolation transformer having first and second secondary windings for supplying both of said rectifiers, an adjustable voltage circuit, the bias windings of said first and second transducers being connected in series and said adjustable voltage circuit being connected between said second rectifier and the series connected bias windings of said first and second transducers, first and second diodes connected to the operating winding of said first transducer and third and fourth diodes connected to the operating winding of said second transducer, said second diode being connected to said third diode and said fourth diode being connected to said first diode to permit the flow of current in only one direction within the operating winding of said first transducer and in the other direction within the operating winding of said second transducer, a first resistor connected to the junction of said first and fourth diodes, the junction of said second and third diodes and said first resistor being coupled to the output of said "AND₁" logic circuit, and a second resistor connected to the junction of said first and fourth diodes, the junction of said second and third diodes and said second resistor being coupled to said output isolation transformer.

6. The improvement according to claim 5 wherein said adjustable voltage circuit comprises a Zener diode connected in shunt across the output of said second rectifier, and a variable resistor connected in series with the shunt connection of said Zener diode and the series connection of the bias windings of said first and second transducers.

7. The improvement according to claim 1 wherein each of said dc/ac converter modules comprises a first winding consisting of the secondary of the electrical isolation transformer between said module and the next preceding module, first and second transistors each having a base, collector and emitter, the bases of said first and second transistors being connected to the ends of said first winding, the emitters of said first and second transistors being connected to each other and to the mid-point of said first winding, and a second winding consisting of the primary of the electrical isolation transformer coupling said module to the next succeeding module, the collectors of said first and second transistors being connected to the two ends of said second winding, the input direct-current signal supplied to said dc/ac converter module being connected between the common connection of the emitters of said first and second transistors and the mid-point of said second winding.

8. The improvement according to claim 1 wherein said "AND₁" logic circuit further comprises a resetting device for connecting a direct-current voltage source to said self-oscillation dc/ac converter.

9. The improvement according claim 1 further comprising $n/m$ logic circuits, the output of each of said $n/m$ logic circuit being connected to one and only one input of said "AND₁" logic circuit, each of said $n/m$ logic circuits comprising $x$ OR circuits each connected to $n$ direct-current voltage inputs representing monitored physical quantities where $x$ is equal to the combinations without repetition of $m$ inputs taken $n$ by $n$ ($x = C_m^n$), and an "AND₂" logic circuit having $x$ input and $x$ dc/ac converter modules, each input being connected to the output of one of said $x$ OR circuits, said "AND₂" logic circuit logically multiplying the outputs of the $x$ OR circuits, said "AND₂" logic circuit including rectifying means to produce one of said $m$ input direct-current signals to said "AND₁" logic circuit.

10. The improvement according to claim 1 further comprising three-out-of-four logic circuits, the output of each logic circuit being connected to one and only input of said "AND$_1$" logic circuit, each of said three-out-of-four logic circuit performing the logical function F$_1$:

$$F_1 = (A + B)(C + D) + (A + C)(B + D),$$

where A, B, C and D are four logical input signals, said three-out-of-four logic circuits comprising
- four OR circuits for performing the logical operations (A + B), (C + D), (A + C) and (B + D),
- two self-supplied "AND$_3$" logic circuits, each of said "AND$_3$" logic circuits comprising two dc/ac converter modules in series, each dc/ac converter module being supplied with a direct-current output voltage from one of said four OR circuits, and
- a fifth OR circuit having as inputs, the outputs of said two "AND$_3$" logic circuits, said fifth OR circuit including rectifying means for supplying one of said m input direct-current signals to said "AND$_1$" logic circuit.

11. The improvement according to claim 1, further comprising three-out-of-four logic circuits, the output of each of said three-out-of-four logic circuits being connected to one and only one input of said "AND$_1$" logic circuit, each three-out-of-four logic circuit performing the function F$_2$:

$$F_2 = AB + AC + AD + BC + BD + CD,$$

where A, B, C and D are four logical input signals corresponding to monitored physical quantities, each of said three-out-of-four logic circuits comprising
- six self-supplied "AND$_4$" logic circuits, each of said "AND$_4$" logic circuit comprising two dc/ac converter modules connected in series for performing the logical operations AB, AC, AD, BC, BD and CD, and
- an OR circuit having its inputs connected to the outputs of said six "AND$_4$" logic circuit, said OR circuit including rectifying means for providing one of said m input direct-current signals as the output of said OR circuit to said "AND$_1$" logic circuit.

* * * * *